United States Patent
Van Der Pasch et al.

(10) Patent No.: US 10,331,045 B2
(45) Date of Patent: Jun. 25, 2019

(54) POSITION MEASUREMENT SYSTEM AND LITHOGRAPHIC APPARATUS

(71) Applicant: ASML NETHERLANDS B.V., Veldhoven (NL)

(72) Inventors: Engelbertus Antonius Fransiscus Van Der Pasch, Oirschot (NL); Emiel Jozef Melanie Eussen, Eindhoven (NL); Robbert Edgar Van Leeuwen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/739,824

(22) PCT Filed: May 26, 2016

(86) PCT No.: PCT/EP2016/061901
§ 371 (c)(1),
(2) Date: Dec. 26, 2017

(87) PCT Pub. No.: WO2017/001124
PCT Pub. Date: Jan. 5, 2017

(65) Prior Publication Data
US 2018/0364594 A1    Dec. 20, 2018

(30) Foreign Application Priority Data

Jun. 30, 2015 (EP) .................................. 15174594

(51) Int. Cl.
*G03F 7/20* (2006.01)
*G01B 9/02* (2006.01)
*G01B 11/27* (2006.01)

(52) U.S. Cl.
CPC ...... *G03F 7/70775* (2013.01); *G01B 9/02018* (2013.01); *G01B 9/02027* (2013.01); *G01B 11/272* (2013.01); *G03F 7/70716* (2013.01)

(58) Field of Classification Search
CPC ............. G03F 7/70308; G03F 7/70316; G03F 7/70775
(Continued)

(56) References Cited

U.S. PATENT DOCUMENTS 5,936,710 A    8/1999  Itoh et al.
6,411,365 B1   6/2002  Takeishi
(Continued)

FOREIGN PATENT DOCUMENTS

CN    104570621    4/2015
JP    H04324304    11/1992
(Continued)

OTHER PUBLICATIONS

International Preliminary Report on Patentability dated Jan. 2, 2018 in corresponding International Patent Application No. PCT/EP2016/061901.
(Continued)

*Primary Examiner* — Hung Nguyen
(74) *Attorney, Agent, or Firm* — Pillsbury Winthrop Shaw Pittman LLP

(57) ABSTRACT

A position measurement system to measure a position of an object relative to a reference, the position measurement system including two interferometers, wherein each interferometer is configured to form a reference beam and a measurement beam from input radiation and to combine the reference beam and the measurement beam to provide output radiation to be delivered to a detector, wherein each interferometer is configured such that the reference beam is formed by reflection of input radiation from a reflective
(Continued)

element, and such that the measurement beam is formed by diffraction of input radiation from a grating on the object, and wherein the reference beam and the measurement beam are parallel to each other.

20 Claims, 4 Drawing Sheets

(58) Field of Classification Search
USPC .............................. 355/53, 67; 356/399–401
See application file for complete search history.

(56) References Cited

U.S. PATENT DOCUMENTS

| | | |
|---|---|---|
| 2007/0058172 A1 | 3/2007 | Van Der Pasch et al. |
| 2007/0146722 A1 | 6/2007 | Trutna et al. |
| 2009/0268210 A1* | 10/2009 | Prince .................... G01D 5/347 356/494 |
| 2010/0020330 A1 | 1/2010 | Owen |
| 2011/0085180 A1* | 4/2011 | Beerens ............. G03F 7/70766 356/614 |
| 2012/0002188 A1 | 1/2012 | Holzapfel et al. |
| 2013/0077100 A1* | 3/2013 | Fukui ................. G01B 11/2441 356/511 |
| 2013/0114062 A1 | 5/2013 | Liesener |
| 2014/0183345 A1 | 7/2014 | Goodwin |

FOREIGN PATENT DOCUMENTS

| | | |
|---|---|---|
| JP | H07229713 | 8/1995 |
| JP | H1019513 | 1/1998 |
| JP | 3891872 | 3/2007 |
| JP | 2007127625 | 5/2007 |
| JP | 2017171206 | 7/2007 |
| JP | 2008519961 | 6/2008 |
| JP | 2011145151 | 7/2011 |
| JP | 2013101084 | 5/2013 |
| JP | 2013546001 | 12/2013 |
| JP | 2015072136 | 4/2015 |

OTHER PUBLICATIONS

International Search Report and Written Opinion dated Aug. 1, 2016 in corresponding International Patent Application No. PCT/EP2016/061901.
Japanese Office Action issued in corresponding Japanese Patent Application No. 2017-567200, dated Nov. 14, 2018.

* cited by examiner

US 10,331,045 B2

POSITION MEASUREMENT SYSTEM AND LITHOGRAPHIC APPARATUS

CROSS REFERENCE TO RELATED APPLICATIONS

This application is the U.S. national phase entry of PCT patent application no. PCT/EP2016/061901, which was filed on May 26, 2016, which claims the benefit of priority of European patent EP application no. 15174594.0, which was filed on Jun. 30, 2015, and which is incorporated herein in its entirety by reference.

BACKGROUND

Field of the Invention

The present invention relates to a position measurement system and to a lithographic apparatus comprising such a system.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Lithographic apparatuses usually comprise many moveable objects, such as patterning device supports, substrate supports, optical components, etc., that need to be positioned accurately. Position measurement systems including interferometers may be used to determine the position of the objects relative to a reference on the basis of which actuators may be operated to move the objects to a desired position.

In case of Fizeau type of interferometers, fiber waveguides may be used to emit radiation towards an object and a reflective element and to receive and combine the reflections from the object and the reflective element to be sent to a corresponding detector. The position of the object is then determined on the basis of a difference in optical path length between the radiation reflected from the object and the radiation reflected from the reflective element.

A drawback of position measurements based on optical path length differences is that for some positions of the object, the optical path length may be relatively large, resulting in an increased sensitivity to humidity, temperature, wavelength variations as well as refractive index variations of the surrounding air.

SUMMARY

It is desirable to provide a position measurement system in which the required optical path length can be kept small.

According to an embodiment of the invention, there is provided a position measurement system to measure a position of an object relative to a reference, comprising two interferometers, wherein each interferometer is configured to form a reference beam and a measurement beam from an input radiation and to combine the reference beam and the measurement beam to provide output radiation to be delivered to a detector, wherein each interferometer is configured such that the reference beam is formed by reflection of input radiation from a reflective element, and such that the measurement beam is formed by diffraction of input radiation from a grating on the object, and wherein the reference beam and the measurement beam are parallel to each other.

According to another embodiment of the invention, there is provided a lithographic apparatus comprising a position measurement system according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
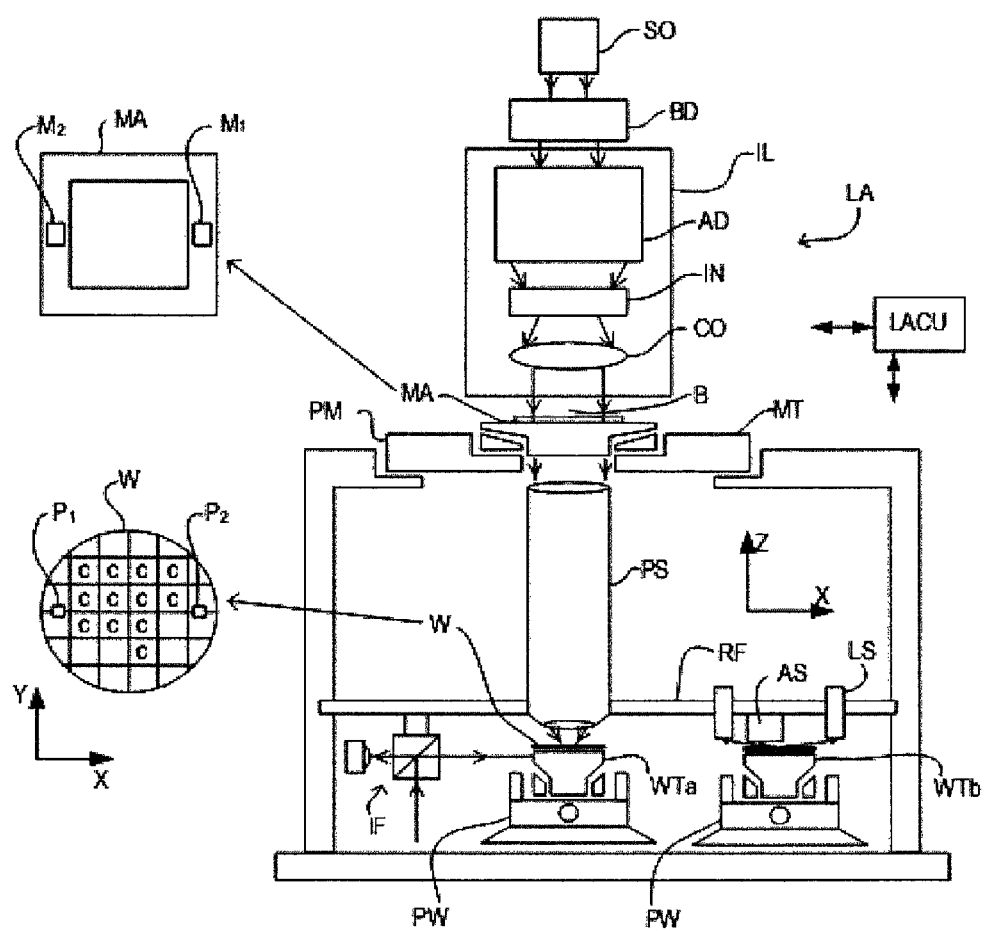
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, and/or controlling radiation.

The term "radiation beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The support structure MT supports, i.e. bears the weight of, the patterning device MA. It holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The radiation source SO and the lithographic apparatus may be separate entities, for example when the radiation source SO is an excimer laser. In such cases, the radiation source SO is not considered to form part of the lithographic apparatus and the radiation beam is passed from the radiation source SO to the illuminator IL with the aid of a beam delivery system BD comprising, for example, suitable directing mirrors and/or a beam expander. In other cases the source may be an integral part of the lithographic apparatus, for example when the source is a mercury lamp. The radiation source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator IL may be used to condition the radiation beam, to have a desired uniformity and intensity distribution in its cross-section.

The radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C (these are known as scribe-lane alignment marks). Similarly, in situations in which more than one die is provided on the patterning device MA, the mask alignment M1, M2 marks may be located between the dies.

The depicted apparatus could be used in at least one of the following modes:

1. In step mode, the patterning device MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the patterning device MT and the substrate table WTa/WTb are scanned synchronously while a pattern imparted to the radiation beam is projected onto a target portion C (i.e. a single dynamic exposure). The velocity and direction of the substrate table WTa/WTb relative to the patterning device MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
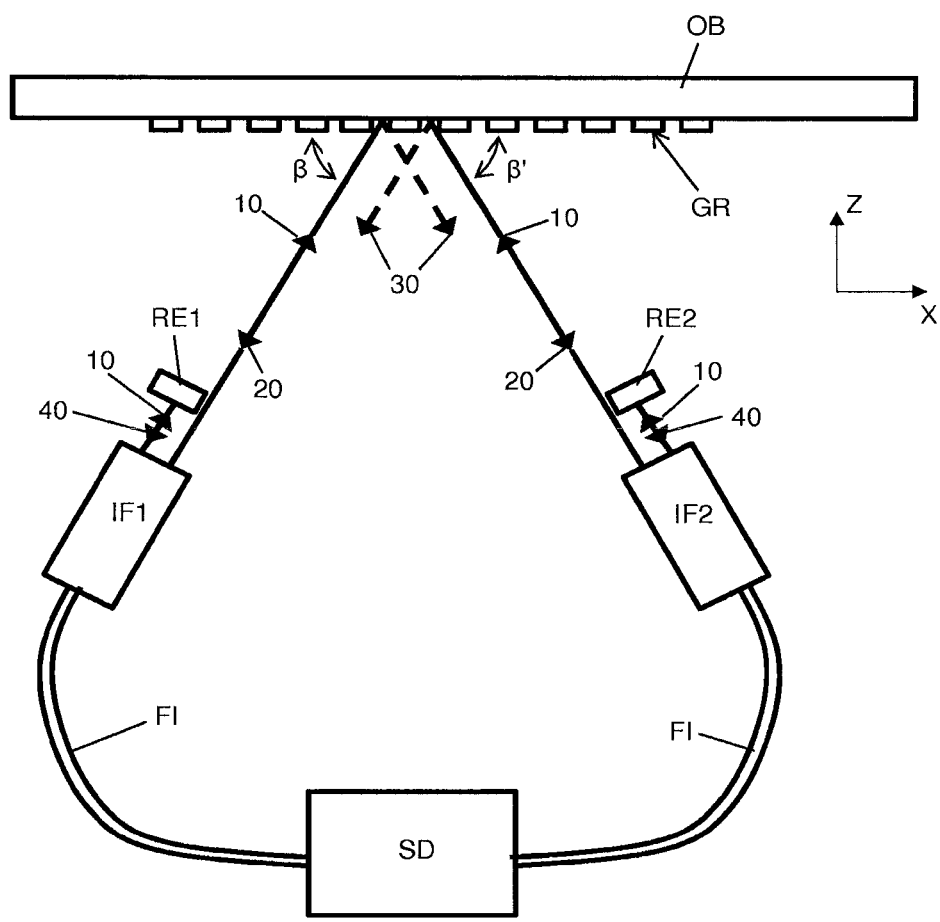
FIG. 2 depicts a position measurement system according to an embodiment of the invention.

FIG. 2 depicts a position measurement system to measure a position of an object OB comprised in the lithographic apparatus LA of FIG. 1, where the object OB may be the substrate support WTa, WTb, the support MT for the patterning device MA, an optical component of the projection system PS or any other moveable object of the lithographic apparatus LA of FIG. 1.

Shown in FIG. 2 are two interferometers IF1, IF2 and a unit SD. The unit SD comprises a light source and one or more detectors. During operation, unit SD directs light from the light source, e.g. a laser or a LED, through fibers FI to interferometers IF1, IF2, Fibers FI also deliver light, i.e. output radiation, from the interferometers IF1, IF2, respectively, to the one or more detectors in the unit SD.

A portion of the input radiation 10 provided by the fibers FI is directed by each interferometer towards a grating GR on the object OB. The grating GR is for instance an amplitude grating or a phase grating.

Input radiation 10 is incident to the grating at an angle $\beta$, $\beta'$ respectively for interferometer IF1, IF2. The angles $\beta$, $\beta'$ are chosen such that the input radiation 10 is diffracted from the grating GR and the first order diffraction beam 20 or a higher order diffraction beam is returned to the respective interferometer IF1, IF2 as measurement beam. Hence, in this embodiment, the reflection 30 of the input radiation from the grating GR, i.e. the zeroth order diffraction beam, is not used by the position measurement system. The angles $\beta$, $\beta'$ may be referred to as littrow angles. It is further noted that in this embodiment, the input radiation 10 of the respective interferometers IF1, IF2 is incident to the grating GR at different locations, so that the reflection 30 of the input radiation of one interferometer does not interfere with the operation of the other interferometer.

Associated with the interferometers IF1, IF2 are reflective elements RE1, RE2. In this embodiment, a portion of the input radiation 10 is incident to the respective reflective element RE1, RE2, which has an orientation such that the input radiation 10 reflects back to the interferometer IF1, IF2, respectively, to form a reference beam 40. The reflective elements RE1, RE2 are provided such that the measurement beams 20 and the reference beams 40 are parallel to each other, e.g. Fizeau like. One or both of the reflective element RE1, RE2, may arranged to reflect a portion of the input radiation 10 to form the reference beam 40, and may be arranged to propagate another portion of the input radiation 10 to form the measurement beam 20. One or both of the reflective element RE1, RE2 may reflect the portion of the input radiation 10 to form the reference beam 40 in a direction parallel to a direction of the measurement beam 20.

The interferometers IF1, IF2 combine the respective measurement beam 20 and the reference beam 40 to provide output radiation that is transmitted to detectors in the unit SD via the fibers FI.

As a result of this configuration, the interference of the measurement beam and the reference beam is sensitive to movement of the object in the Z-direction as well as the X-direction, because for both movements the spot where the input radiation 10 from an interferometer IF1, IF2 is incident on the grating GR will change thereby changing the relative phase between measurement beam 20 and reference beam 40.

Due to the mirrored configuration of interferometers IF1, IF2, the phase change between measurement beam and reference beam will change differently in the X- or Z-direction, so that the movement of the object in Z-direction can be determined by subtracting the signals of the interferometers IF1, IF2 and the movement of the object in X-direction can be determined by adding the signals of the interferometers IF1, IF2 or vice versa.

An advantage of the position measurement system compared to the prior art is that the moving range in the X-direction has no influence on the path length of the measurement beam 20 and reference beam 40, so that the path length is able to remain relatively small when the moving range in the Z-direction is relatively small. The same advantage can be obtained in an Y-direction perpendicular to the Z- and X-directions. Hence, only one moving range needs to be small to be able to obtain the advantages of this invention.

Figure 3:
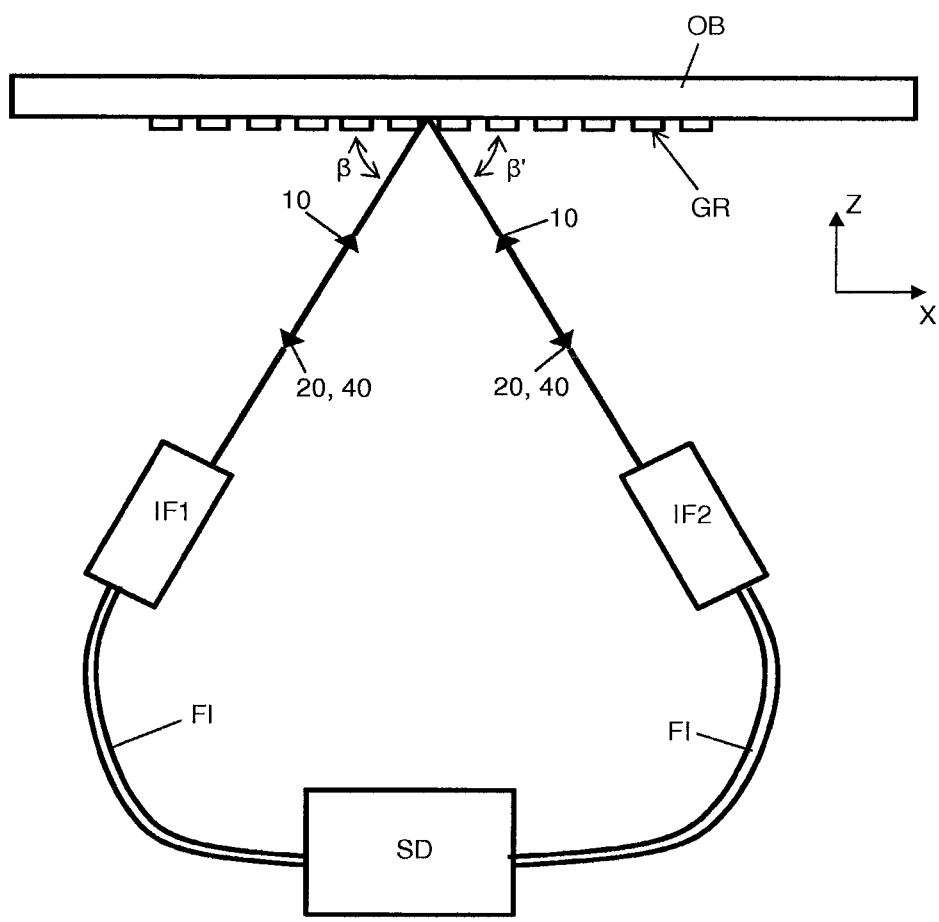
FIG. 3 depicts a position measurement system according to an alternative embodiment of the invention.

FIG. 3 depicts an alternative embodiment of a position measurement system according to the invention. The system is similar to the position measurement system of FIG. 2 and also comprises two interferometers IF1, IF2, a unit SD, and a plurality of fibers FI to cooperate with a grating GR on the object OB. During operation, the unit SD directs light from a light source, e.g. a laser or a LED, through fibers FI to interferometers IF1, IF2. The fibers FI also deliver light, i.e. output radiation, from the interferometers IF1, IF2, to one or more detectors in the unit SD.

The input radiation 10 provided by the fibers FI is directed by each interferometer towards a grating GR on the object OB.

Input radiation 10 is incident to the grating at an angle $\beta$, $\beta'$ respectively for interferometer IF1, IF2. The angles $\beta$, $\beta'$ are chosen such that the input radiation 10 is diffracted from the grating GR and the first order diffraction beam 20 or a higher order diffraction beam is returned to the respective interferometer IF1, IF2 as measurement beam. The angles $\beta$, $\beta'$ may be referred to as littrow angles.

The embodiment of FIG. 3 differs from the embodiment of FIG. 2 in that the object OB is also used as reflective element, so that the zeroth order diffraction beam, i.e. the reflection of the input radiation 10 of one interferometer IF1/IF2, forms a reference beam 40 for the other interferometer IF1/IF2. Hence, a separate reflective element, such as reflective elements RE1, RE2 as in the embodiment of FIG. 2 is not required, but the input radiation 10 from both interferometers IF1, IF2 coincide and overlap at least partially.

Figure 4:
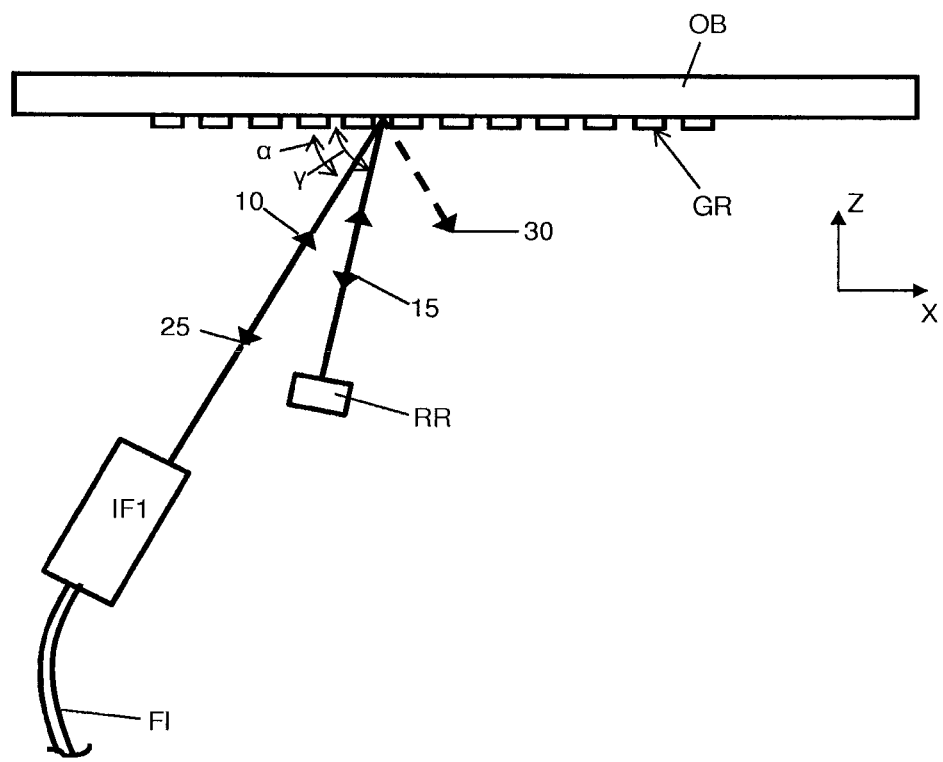
FIG. 4 depicts a position measurement system according to yet another embodiment of the invention.

FIG. 4 depicts yet a further embodiment of a position measurement system according to the invention. In FIG. 4 only one interferometer IF1 is shown for simplicity reasons, but it is envisaged that the position measurement system comprises a mirrored interferometer IF2 as in the configuration of FIG. 2 with using a reflective element per interferometer (not shown in FIG. 4) or as in the configuration of FIG. 3 in which the object is the reflective element for the interferometers and the reflection of the incident input radiation of one interferometer is used as a reference beam for the other interferometer.

In FIG. 4, the input radiation 10 is incident to the grating GR of the object OB at an angle $\alpha$ such that a the input radiation 10 is divided into a diffraction beam 15 and a reflection 30. The diffraction beam 15 is directed towards a reflector RR, like a cat's eye, cube corner, retroreflector or simply a lens and a mirror. The diffraction beam 15 is reflected back by the reflector RR towards the grating GR to be diffracted a second time. The angles $\alpha$ and $\gamma$ are such that during the second diffraction from the grating GR, the diffraction beam 15 is diffracted into a diffraction beam 25. The diffraction beam 25 is directed towards the interferometer IF1 to form a measurement beam. The advantage of diffracting multiple times from the grating GR is that the sensitivity of the phase shift to movement of the object OB increases and thus smaller movements can be detected improving the accuracy of the measurement system.

Figure 5:
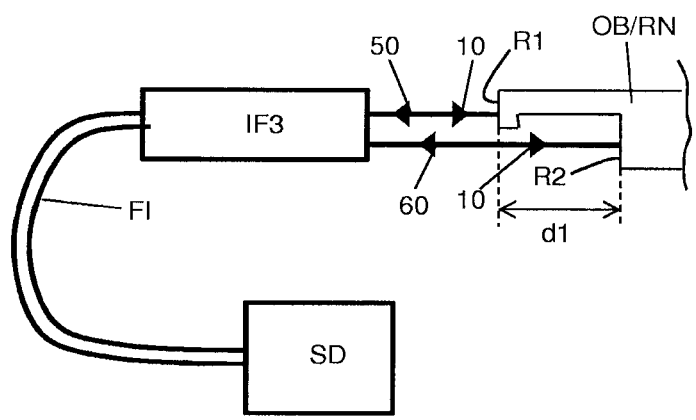
FIG. 5 depicts an additional interferometer to be used with a position measurement system according to an embodiment of the invention.

The measurement can further be improved by providing an interferometer IF3 as depicted in FIG. 5. The interferometer IF3 receives the input radiation 10 from a unit SD via fibers FI. The input radiation 10 is directed by the interferometer IF3 towards an object OB or reference RN having a first reflector R1 and a second reflector R2. A portion of the input radiation 10 is reflected from the first reflector R1 to form a first reflective beam 50. Another portion of the input radiation 10 is reflected from the second reflector R2 to form a second reflective beam 60. The first reflective beam 50 and second reflective beam 60 are combined by the interferometer IF3 and directed to a detector in the unit SD.

By providing the first reflector R1 and second reflector R2 at a constant distance dl with respect to each other, the signal derived at the detector will be sensitive to other phenomena such as wavelength variation, refractive index variations of the surrounding air, temperature and humidity which information can be used to correct or compensate the signals derived from other interferometers in the position measurement system. The constant distance dl may be provided by using a zerodur spacer between the first reflector R1 and the second reflector R2.

Although the invention has only been shown with respect to a position measurement system comprising two interferometers, i.e. a pair of interferometers, it will be apparent to the skilled person to add more interferometers for other directions as well. Hence, the invention can also be used to provide a six degree of freedom position measurement system.

In an embodiment, there is provided a position measurement system to measure a position of an object relative to a reference, the position measurement system comprising two interferometers, wherein each interferometer is configured to form a reference beam and a measurement beam from an input radiation and to combine the reference beam and the measurement beam to provide output radiation to be delivered to a detector, wherein each interferometer is configured such that the reference beam is formed by reflection of input radiation from a reflective element, and such that the measurement beam is formed by diffraction of input radiation from a grating on the object, and wherein the reference beam and the measurement beam are parallel to each other.

In an embodiment, the reflective element is arranged to reflect a portion of the input radiation to form the reference beam, and wherein the reflective element is arranged to propagate another portion of the input radiation to form the measurement beam. In an embodiment, the reflective element is directly in front of the interferometer. In an embodiment, the input radiation of the two interferometers is incident to the grating on the object at different positions, so that the reflection of the input radiation of one interferometer does not interfere with the operation of the other interferometer. In an embodiment, the interferometers are configured such that corresponding input radiation is incident to the grating at a Littrow angle. In an embodiment, the input radiation of the two interferometers is incident to the grating on the object at substantially the same location, and wherein the object comprises the reflective element, so that the reflection of the input radiation of one interferometer from the reflective element is the reference beam for the other interferometer. In an embodiment, the measurement beam is formed by diffracting multiple times at the grating on the object before being directed back towards the interferometer. In an embodiment, the position measurement system comprises at least one reflector to reflect a diffracted beam back towards the grating on the object. In an embodiment, the position measurement system further comprises a plurality of waveguides, wherein each waveguide is configured to deliver the input radiation to a corresponding interferometer and/or to deliver the output radiation from the corresponding interferometer to a corresponding detector. In an embodiment, the position measurement system according to one of the preceding claims, further comprising a third interferometer, the third interferometer being configured to form a first reference beam and a second reference beam from the input radiation and to combine the first and second reference beams to provide output radiation to be delivered to a corresponding detector, wherein the first reference beam is formed by reflection of input radiation from a first reflector, wherein the second reference beam is formed by reflection of input radiation from a second reflector, and wherein the first and second reflector are fixed at a constant distance from each other. In an embodiment, the position measurement system further comprises at least one waveguide, wherein the at least one waveguide is configured to deliver the input radiation to the third interferometer and to deliver the output radiation from the third interferometer to the corresponding detector.

In an embodiment, there is provided a lithographic apparatus comprising a position measurement system as described herein. In an embodiment, the lithographic apparatus comprises a support structure arranged to support a patterning device having a pattern; a substrate table arranged to support a substrate; a projection system arranged to project the pattern onto the substrate, wherein the object comprises one of the support structure and the substrate table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. A position measurement system to measure a position of an object relative to a reference, the position measurement system comprising two interferometers,
    wherein each of the two interferometers is configured to form a reference beam and a measurement beam from an input radiation and to combine the reference beam and the measurement beam to provide output radiation to be delivered to a detector,
    wherein each of the two interferometers is configured such that the reference beam is formed by reflection of input radiation from a reflective element, and such that the measurement beam is formed by diffraction of input radiation from a grating on the object, and
    wherein the reflective element is arranged to reflect a portion of the input radiation to form the reference beam in a direction essentially parallel to a direction of propagation of the measurement beam from the grating.

2. The position measurement system according to claim 1, wherein the reflective element is arranged to propagate another portion of the input radiation to form the measurement beam.

3. The position measurement system according to claim 2, wherein the reflective element is directly in front of the respective interferometer.

4. The position measurement system according to claim 1, wherein the input radiation of the two interferometers is incident to the grating on the object at different positions, so that the reflection of the input radiation of one interferometer does not interfere with the operation of the other interferometer.

5. The position measurement system according to claim 1, wherein the two interferometers are configured such that corresponding input radiation is incident to the grating at a Littrow angle.

6. The position measurement system according to claim 1, wherein the input radiation of the two interferometers is incident to the grating on the object at substantially the same location, and wherein the object comprises the reflective element, so that the reflection of the input radiation of one interferometer from the reflective element is the reference beam for the other interferometer.

7. The position measurement system according to claim 1, wherein the measurement beam is formed by diffracting multiple times at the grating on the object before being directed back towards the respective interferometer.

8. The position measurement system according to claim 7, comprising a reflector to reflect a diffracted beam back towards the grating on the object.

9. The position measurement system according to claim 1, further comprising a plurality of waveguides, wherein each of the waveguides is configured to deliver the input radiation to a corresponding interferometer and/or to deliver the output radiation from the corresponding interferometer to a corresponding detector.

10. The position measurement system according to claim 1, further comprising a third interferometer, the third interferometer configured to form a first reference beam and a second reference beam from the input radiation and to combine the first and second reference beams to provide output radiation to be delivered to a corresponding detector,
wherein the first reference beam is formed by reflection of input radiation from a first reflector,
wherein the second reference beam is formed by reflection of input radiation from a second reflector, and
wherein the first and second reflectors are fixed at a constant distance from each other.

11. The position measurement system according to claim 10, further comprising a waveguide, wherein the waveguide is configured to deliver the input radiation to the third interferometer and to deliver the output radiation from the third interferometer to the corresponding detector.

12. A lithographic apparatus comprising the position measurement system according to claim 1.

13. The lithographic apparatus of claim 12, comprising:
a support structure arranged to support a patterning device having a pattern;
a substrate table arranged to support a substrate; and
a projection system arranged to project the pattern onto the substrate;
wherein the object comprises the support structure or the substrate table.

14. A method, comprising:
measuring a position of an object relative to a reference using a position measurement system comprising two interferometers;
using each of the two interferometers, forming a reference beam and a measurement beam from an input radiation and combing the reference beam and the measurement beam to provide output radiation to be delivered to a detector; and
using each of the two interferometers, forming the reference beam by reflection of input radiation from a reflective element, and forming the measurement beam by diffraction of input radiation from a grating on the object,
wherein the reflective element is arranged to reflect a portion of the input radiation to form the reference beam in a direction essentially parallel to a direction of propagation of the measurement beam from the grating.

15. The method according to claim 14, further comprising propagating another portion of the input radiation from the reflective element to form the measurement beam.

16. The method according to claim 14, wherein the input radiation of the two interferometers is incident to the grating on the object, at different positions, so that the reflection of the input radiation of one interferometer does not interfere with the operation of the other interferometer.

17. The method according to claim 14, wherein the two interferometers are configured such that corresponding input radiation is incident to the grating at a Littrow angle.

18. The method according to claim 14, wherein the input radiation of the two interferometers is incident to the grating on the object at substantially the same location, and wherein the object comprises the reflective element, so that the reflection of the input radiation of one interferometer from the reflective element is the reference beam for the other interferometer.

19. The method according to claim 14, wherein the measurement beam is formed by diffracting multiple times at the grating on the object before being directed back towards the respective interferometer.

20. The method according to claim 14, comprising using a reflector to reflect a diffracted beam back towards the grating on the object.

* * * * *